United States Patent
Lee et al.

(10) Patent No.: US 6,518,141 B2
(45) Date of Patent: Feb. 11, 2003

(54) METHOD FOR MANUFACTURING A RADIO FREQUENCY INTEGRATED CIRCUIT ON EPITAXIAL SILICON

(75) Inventors: Kae-Hoon Lee, Seoul (KR); Jae-Seung Kim, Seoul (KR); Hong-Seub Kim, Seoul (KR)

(73) Assignee: Anam Semiconductor Inc., Seoul (KR)

( * ) Notice: Subject to any disclaimer, the term of this patent is extended or adjusted under 35 U.S.C. 154(b) by 0 days.

(21) Appl. No.: 09/946,935

(22) Filed: Sep. 4, 2001

(65) Prior Publication Data

US 2002/0028557 A1 Mar. 7, 2002

(30) Foreign Application Priority Data

Sep. 5, 2000 (KR) .......................................... 00-52258

(51) Int. Cl.[7] .............................................. H01L 21/36
(52) U.S. Cl. ...................... 438/381; 438/481; 438/622
(58) Field of Search ................................. 438/150, 164, 438/381, 459, 481, 622

(56) References Cited

U.S. PATENT DOCUMENTS

| | | | | |
|---|---|---|---|---|
| 5,068,203 A | * | 11/1991 | Logsdon et al. | 437/89 |
| 5,559,349 A | * | 9/1996 | Cricchi et al. | 257/273 |
| 5,918,121 A | * | 6/1999 | Wen et al. | 438/243 |
| 5,948,162 A | * | 9/1999 | Nakamura | 117/90 |
| 6,228,691 B1 | * | 5/2001 | Doyle | 438/149 |
| 6,287,931 B1 | * | 9/2001 | Chen | 438/381 |
| 6,362,510 B1 | * | 3/2002 | Gardner et al. | 257/374 |

* cited by examiner

*Primary Examiner*—Chandra Chaudhari
*Assistant Examiner*—Stephen W. Smoot
(74) *Attorney, Agent, or Firm*—Fulbright & Jaworski L.L.P.

(57) ABSTRACT

Disclosed are an RF integrated circuit and method for manufacturing the same. The RF integrated circuit comprises an insulating layer including a plurality of windows; epitaxial silicon layers separately formed on the insulating layer; semiconductor elements formed on the epitaxial silicon layers; a PMD layer formed on the epitaxial silicon layers and the insulating layer, and including contacts that connecting the semiconductor elements; a first metal wiring layer formed on the PMD layer; an IMD layer formed on the first metal wiring layer, and including vias connecting the first metal wiring layer; a second metal wiring layer formed on the IMD layer; and a capping layer formed on the second metal wiring layer.

17 Claims, 4 Drawing Sheets

METHOD FOR MANUFACTURING A RADIO FREQUENCY INTEGRATED CIRCUIT ON EPITAXIAL SILICON

BACKGROUND OF THE INVENTION (a) Field of the Invention

The present invention relates to a radio frequency integrated circuit and a method for manufacturing the same. More particularly, the present invention relates to a radio frequency integrated circuit and a method for manufacturing the same in which leakage of current to a semiconductor substrate by radio frequency (RF) coupling is prevented such that a high quality factor is obtained.

(b) Description of the Related Art

The term "semiconductor" is very often taken to mean a semiconductor device manufactured with semiconducting materials, and semiconductor devices are classified into individual semiconductor elements and integrated circuits.

Individual semiconductor elements such as transistors, diodes, rectifiers and light converting elements (light emitting, light receiving elements) are devices made to perform specific functions in a circuit. By selecting a specific variety of semiconductor elements, an electronic circuit that executes a desired operation can be designed.

Further, with the integrated circuit, specific individual elements are provided in a single semiconductor chip to configure a circuit. There is continued development of radio frequency (RF) integrated circuits in recent times to increase the speed and reduce power consumption of semiconductor integrated circuits. The RF integrated circuit operates at radio frequencies of tens of cycles per second.

FIG. 1 shows a schematic sectional view of a conventional RF integrated circuit. It should be noted that a plurality of the elements to be described below are provided over an area of the integrated circuit.

In the conventional RF integrated circuit, a field oxide layer 2 is formed in a specific area of a semiconductor substrate 1 in order to form element separation areas, thereby defining active areas in the semiconductor substrate 1. A semiconductor element 3, which includes a gate G, a source S and a drain D, is formed in an active area of the semiconductor substrate 1. Also, a pre-metal dielectric (PMD) layer 4 is formed on the semiconductor element 3 and the field oxide layer 2. The PMD layer 4 electrically insulates the semiconductor substrate 1, which includes each element electrode of the semiconductor element 3, from a metal wiring layer. Also, a contact 5, for electrically connecting the element electrodes and the metal wiring layer, is formed in the PMD layer 4.

A first metal wiring layer 6 is formed on the PMD layer 4 and is connected to the contact 5. Further, an inter-metal dielectric (IMD) layer 7 is formed on the first metal wiring layer 6. The IMD layer 7 electrically insulates the first metal wiring layer 6 from an upper metal wiring layer. There is also included a via 8, which is formed in the IMD layer 7. The via 8 electrically connects the first metal wiring layer 6 to an upper metal wiring layer.

A second metal wiring layer 9, which is connected to the via 8, is formed on the IMD layer 7. Also, spiral coils 10 for forming inductors in the RF integrated circuit are provided in the second metal wiring layer 9 connecting specific vias 8. Finally, a capping layer 11 is formed on the second metal wiring layer 9.

In the conventional RF integrated circuit structured as in the above, a quality factor (Q), which is a multiple of a current flowing to both ends of an inductor (having an inductance L) of a spiral coil, is as shown in Equation 1 below.

$$Q=R/(wL) \qquad \text{[Equation 1]}$$

where w is $2\pi f$, in which f is a frequency in resonance, and R is a resistance of a semiconductor substrate.

A value of the Q determined by Equation 1 is used as a target for a performance level of an inductor. Further, with reference to the graph of FIG. 2, which shows variations in characteristics of an inductor according to changes in resistance of a substrate, a value of the Q increase with increases in the resistance of a semiconductor substrate.

However, if there occurs current leakage ($J_{RF}$ in FIG. 1) as a result of RF coupling between the semiconductor substrate and an inductor, the value of the Q is negatively affected. To minimize a reduction in the value of the Q caused by current leakage, a high resistance GaAs substrate is used.

However, such high resistance GaAs substrates are costly and difficult to manufacture to large sizes, such as to an area of 8 square inches.

SUMMARY OF THE INVENTION

The present invention has been made in an effort to solve the above problems.

It is an object of the present invention to provide a radio frequency integrated circuit and a method for manufacturing the same, in which the integrated circuit can be easily manufactured to large sizes, and in which a high quality factor is obtained using a silicon wafer of a minimal unit price.

To achieve the above object, the present invention provides an RF integrated circuit and a method for manufacturing the same. The RF integrated circuit comprises an insulating layer including a plurality of windows; epitaxial silicon layers formed in a separated state on the insulating layer; semiconductor elements formed on the epitaxial silicon layers; a PMD layer formed on the epitaxial silicon layers and the insulating layer, and including contacts that connect electrode regions of the semiconductor elements; a first metal wiring layer formed on the PMD layer, and which forms circuit wiring by a metal film pattern connecting the contacts; an IMD layer formed on the first metal wiring layer, and including vias connecting portions of the first metal wiring layer; a second metal wiring layer formed on the IMD layer, and which forms circuit wiring by a thin film pattern connecting the vias; and a capping layer formed on the second metal wiring layer.

According to a feature of the present invention, the epitaxial silicon layer is formed on each the window.

According to another feature of the present invention, the second metal wiring layer includes spiral coils, which form inductors and connect specific vias.

The method comprises the steps of (a1) forming an insulating layer on a silicon wafer, and selectively etching the insulating layer to form a plurality of windows that expose the silicon wafer; (b1) forming an epitaxial silicon layer over an entire surface of the insulating layer by an epitaxial growth method using portions of the silicon wafer exposed through the windows, and planarized the epitaxial silicon layer; (c1) selectively etching the epitaxial silicon layer to realize a plurality of the epitaxial silicon layers, in which the epitaxial silicon layers of the each window region are separated; (d1) forming semiconductor elements on the epitaxial silicon layers; (e1) forming a PMD layer on the epitaxial silicon layers, and selectively etching the PMD layer to form contact holes for exposing portions of electrodes of the semiconductor elements; (f1) providing metal plugs in the contact holes, and forming and patterning a metal film to realize a first metal wiring layer; (g1) forming an IMD layer over the first metal wiring layer, and selectively etching the IMD layer such that portions of the first metal wiring layer are exposed to form via holes; (h1) providing metal plugs in the via holes to form vias, and forming and patterning a metal film on the IMD layer to form a second metal wiring layer; and (i1) forming a capping layer on the second metal wiring layer, and removing the silicon wafer.

According to a feature of the present invention, step (c1) is performed after the step (d1) of forming semiconductor elements on the epitaxial silicon layer.

According to another feature of the present invention, in step (a1), the insulatin layer is formed by CVD process.

According to yet another feature of the present invention, in step (b1), the epitaxial silicon layer is planarized by CMP.

According to still yet another feature of the present invention, in step (h1), spiral coils connecting specific vias are formed when the metal film on the IMD layer is patterned.

According to still yet another feature of the present invention, after step (i1) of removing the silicon wafer after forming the capping layer is formed on the second metal wiring layer, the capping layer is used as a support and a polishing process is performed on the silicon wafer to remove the silicon wafer.

According to still yet another feature of the present invention, a chemical mechanical polishing process is used as the polishing process.

According to still yet another feature of the present invention, the capping layer is formed to a thickness of between 50 and 100 µm.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

Figure 1:
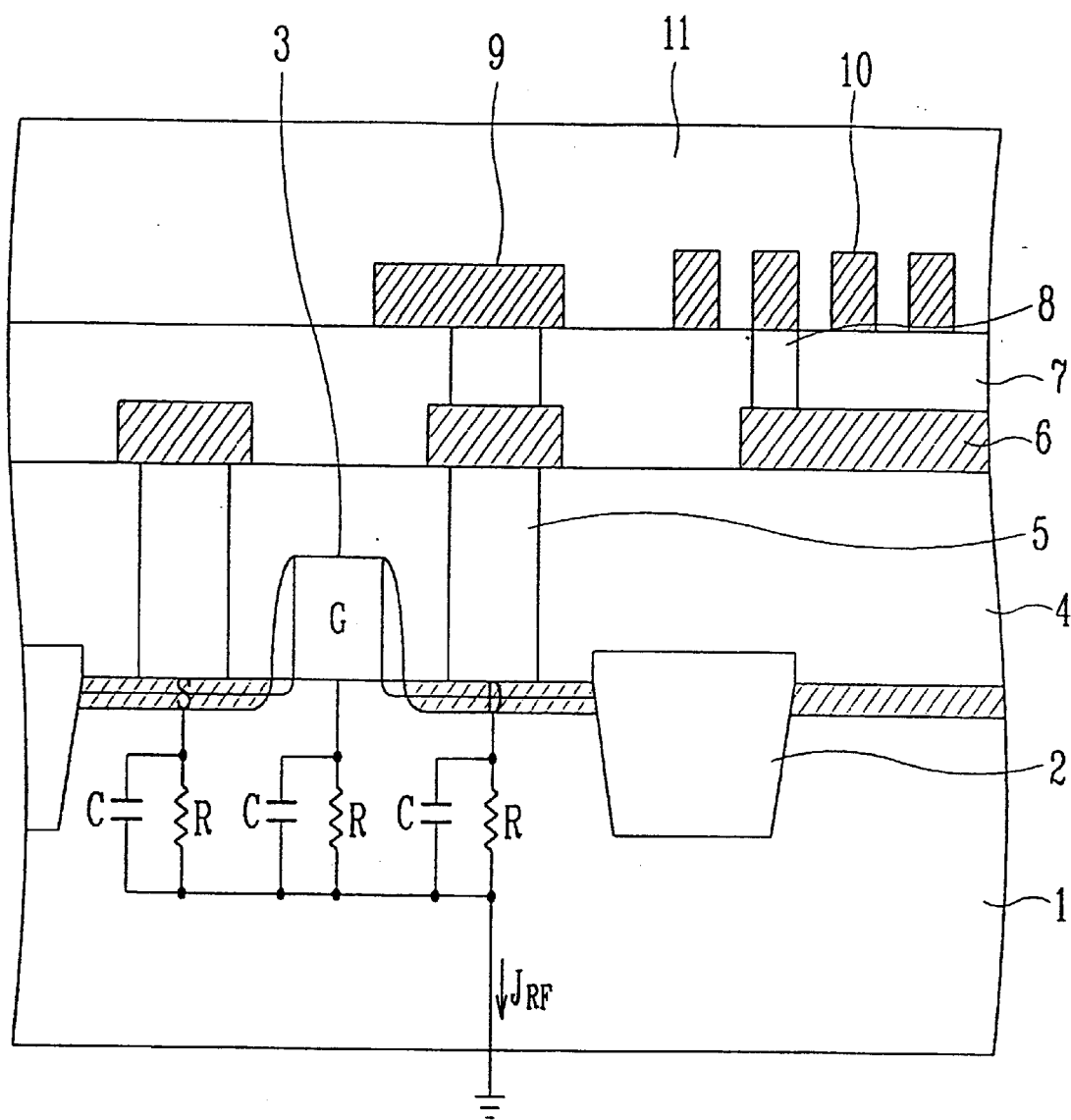
FIG. 1 is a schematic sectional view of a conventional RF integrated circuit.
Figure 2:
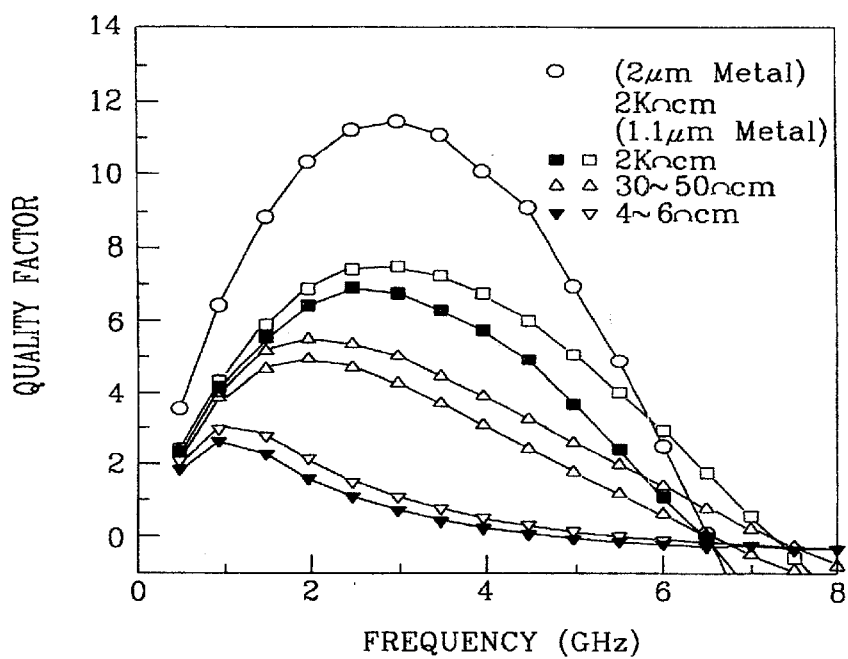
FIG. 2 is a graph showing variations in characteristics of an inductor according to changes in resistance of a semiconductor substrate in a radio frequency integrated circuit.
Figure 3:
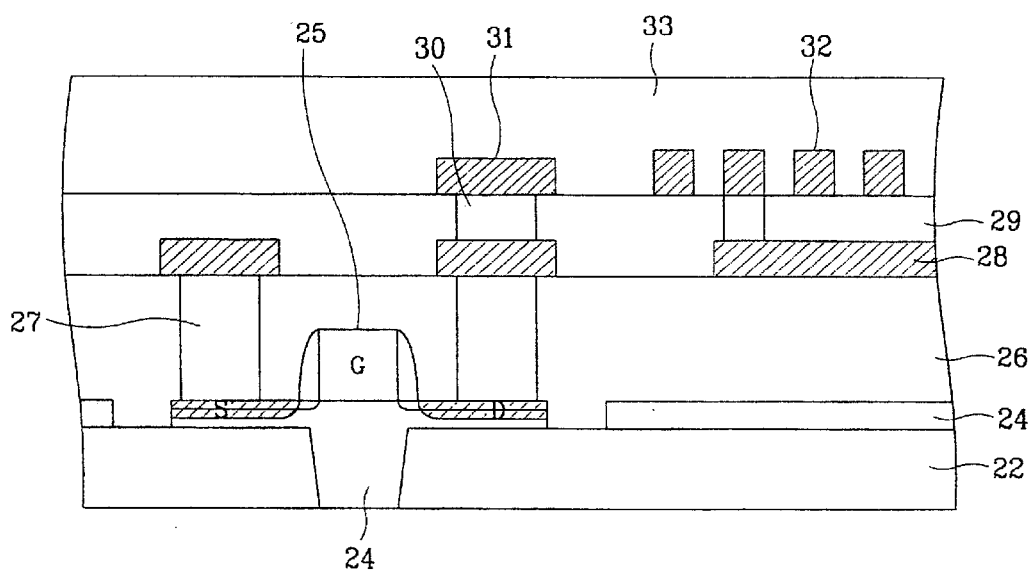
FIG. 3 is a schematic sectional view of a radio frequency integrated circuit according to a preferred embodiment of the present invention.

FIG. 3 shows a schematic sectional view of a radio frequency integrated circuit according to a preferred embodiment of the present invention.

As shown in the drawing, a plurality of windows are formed in an insulating layer 22, and a plurality of epitaxial silicon layers 24 are formed in a separated state within the windows and on the insulating layer 22. Semiconductor elements 25, which include a gate G, a source S and a drain D, are formed on predetermined epitaxial silicon layers 24.

Further, a PMD layer 26 for insulating the semiconductor elements 25 from a metal wiring layer is formed on the epitaxial silicon layers 24 and exposed portions of the insulating layer 22. Contacts 27 are formed in the PMD layer 26 in areas to electrically connect element electrodes and a metal wiring layer.

Formed in a predetermined pattern on the PMD layer 26 is a first metal wiring layer 28, with portions of the first metal wiring layer 28 corresponding to the locations of the contacts 27. An IMD layer 29 is formed covering the first metal wiring layer 28 on the PMD layer 26. The IMD layer 29 insulates the first metal wiring layer 28 from a second metal wiring layer 31 (to be described below). Further, vias 30 are formed in the IMD layer 29 at predetermined areas to electrically connect portions of the first metal wiring layer 28 to the second metal wiring layer 31.

The second metal wiring layer 31 is formed in a predetermined pattern on the IMD layer 29 that is in a state of connecting the vias 30. Also, spiral coils 32, which form inductors in an RF integrated circuit, are formed connecting specific vias 30 in the second metal wiring layer 31. Finally, a capping layer 33 is formed covering the second metal wiring layer 31 and the spiral coils 32.

Therefore, in the RF integrated circuit of the present invention, a lower semiconductor layer is not used as with the prior art, and instead, epitaxial silicon layers in a separated state are provided on an insulating layer and semiconductor elements are formed on the epitaxial silicon layers. Accordingly, the leakage of current as a result of RF coupling between the substrate and inductors is prevented such that an RF integrated circuit having a high quality factor is obtained.

FIGS. 4a–4e show schematic sectional views of the RF integrated circuit of the present invention as it undergoes sequential manufacturing processes.

Figure 4A:
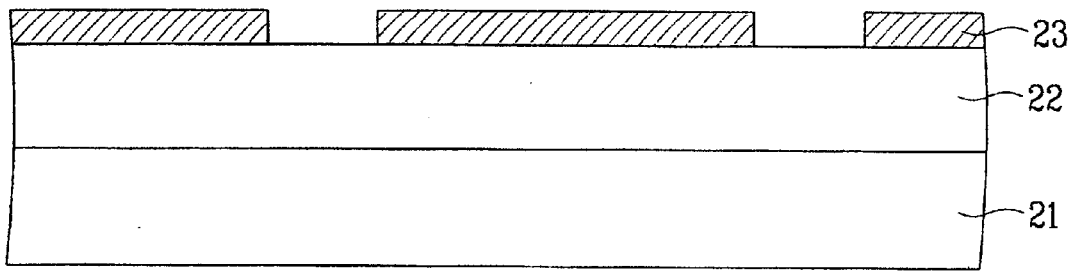
FIGS. 4a–4e are schematic sectional views of the radio frequency integrated circuit of FIG. 3 as it undergoes sequential manufacturing processes.

First, with reference to FIG. 4a, the insulating layer 22 is formed on a silicon wafer 21 at a thickness of 1 to 10 µm, or more. The insulating layer 22 acts to separate elements of the circuit. The insulating layer 22 may be formed by thermally oxidizing the silicon wafer 21 to form a thermal oxide layer, or by forming an oxidation layer using a chemical vapor deposition process performed on the silicon wafer 21. Next, a mask pattern 23 having windows is formed on the insulating layer 22. The mask pattern 23 may be formed by depositing a photosensitive layer on the insulating layer 22 and exposing the photosensitive layer to light source using a mask that includes a window pattern and developing the photosensitive layer that are exposed the light source.

Figure 4B:
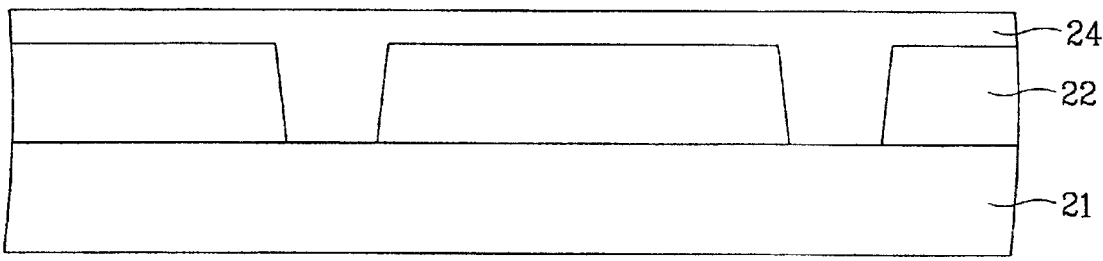

Next, with reference to FIG. 4b, portions of the insulating layer 22 exposed through the mask pattern 23 are etched— preferably reactive ion etched (RIE)—until the silicon wafer 21 is exposed, thereby forming the windows in the insulating layer 22. The mask pattern 23 is then removed from the insulating layer 22. Following this step, a selective epitaxial growth method using the silicon wafer 21 exposed through the windows of the insulating layer 22 is employed to grow the epitaxial silicon layer 24 over an entire surface of the insulating layer 22 and in the windows of the same.

Figure 4C:
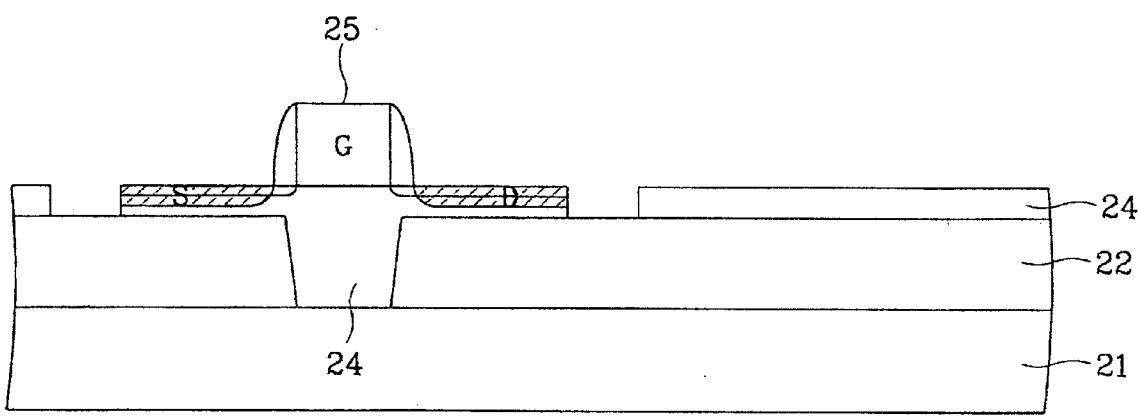

Subsequently, with reference to FIG. 4c, the epitaxial silicon layer 24 is planarized preferably using a chemical mechanical polishing (CMP) process.

Next, the epitaxial silicon layer 24 is selectively etched to realize a plurality of the epitaxial silicon layers 24, in which the epitaxial silicon layers 24 on the insulating layer 22 including each the window are separated. As an example of how the epitaxial silicon layers 24 are formed, a photosensitive layer is deposited on the planarized, initial epitaxial silicon layer 24, and exposure and develop is performed using a mask having a pattern for forming the element separation regions to thereby form a photosensitive pattern. Next, portions of the epitaxial silicon layer 24 exposed on predetermined regions of the insulating layer 22 are etched and removed to realize element separation. Subsequently, the semiconductor elements 25, which include element electrodes such as the gate G, source S and drain D, are formed on predetermined epitaxial silicon layers 24. Alternatively, after the semiconductor elements 25 are formed on the epitaxial silicon layers 24 provided on the windows, the epitaxial silicon layers 24 may be selectively etched such that each semiconductor element 25 of a window region is separated.

Figure 4D:
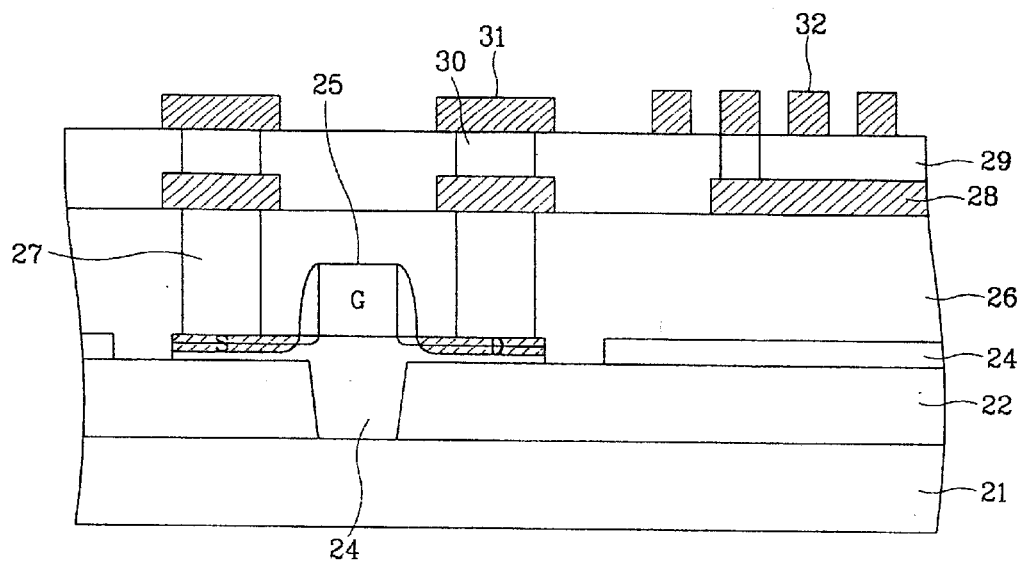

Following the above, with reference to FIG. 4d, the PMD layer 26 for insulating each electrode of the semiconductor elements 25 from a metal wiring layer is formed on the epitaxial silicon layers 24 and exposed portions of the insulating layer 22. Next, the PMD layer 26 is selectively etched to form contact holes for exposing portions of each electrode region of the semiconductor elements 25 such as the gate G, source S and drain D. Formed in the contact holes are metal plugs, preferably tungsten plugs, to thereby form the contacts 27 for electrically connecting the element electrodes of the semiconductor elements 25 with a metal wiring layer.

After the above, a metal film for realizing a metal wiring layer is formed over an entire surface of the PMD layer 26. The metal film is then patterned to form the first metal wiring layer 28, with portions of the first metal wiring layer 28 in connect with the contacts 27. Next, the IMD layer 29 is formed over the first metal wiring layer 28. The IMD layer 29 insulates the first metal wiring layer 28 from an upper metal wiring layer. The IMD layer 29 is then selectively etched such that portions of the first metal wiring layer 28 are exposed to form via holes. Formed in the via holes are metal plugs, preferably tungsten plugs, to thereby form vias 30 for circuit connect with an upper metal wiring layer.

Subsequently, a metal film is formed on the IMD layer 29. The metal film is patterned to form circuit wiring connecting the vias 30, thereby forming the second metal wiring layer 31. During the patterning of the metal film for forming the second metal wiring layer 31, there are also formed the spiral coils 32 connecting specific vias 30 to thereby realize inductors in the RF integrated circuit.

Figure 4E:
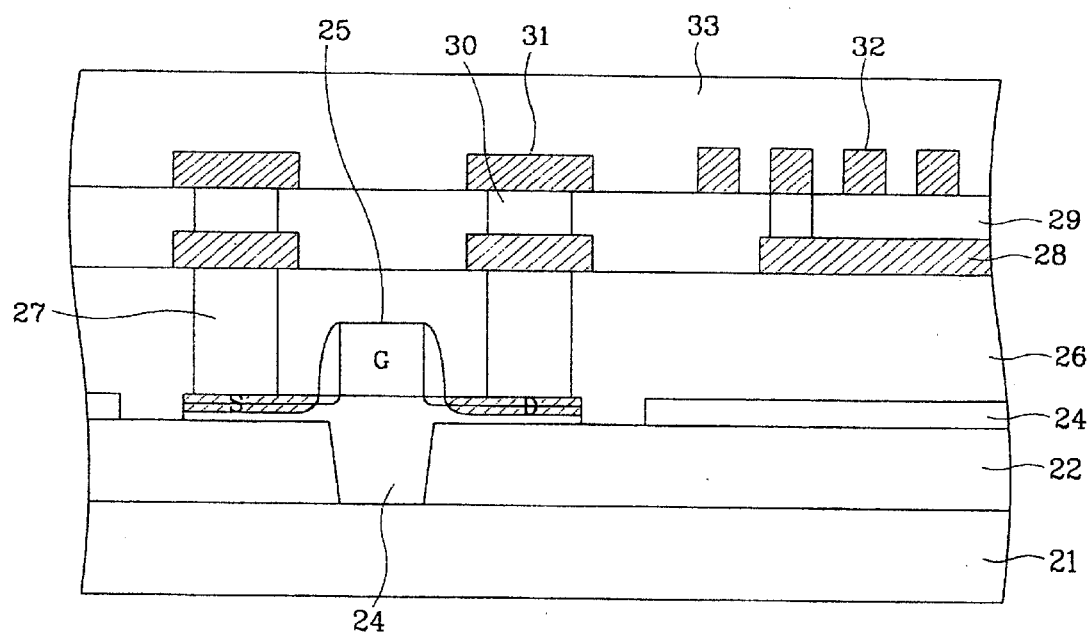

Next, with reference to FIG. 4e, the capping layer 33 is formed covering the second metal wiring layer 31 and the spiral coils 32 contained in the second metal wiring layer 31. It is preferable that the capping layer 33 is formed to a thickness of between 50 and 100 $\mu$m. Also, it is preferable that the capping layer 33 is made from an oxide layer.

As a final step, the silicon wafer 21 under the insulating layer 22 is removed to complete the RF integrated circuit as shown in FIG. 3. The silicon wafer 21 may be removed by using the capping layer 33 as a support, and performing CMP process on the silicon wafer 21 until it is removed.

In the RF integrated circuit and method for manufacturing the same of the present invention described above, instead of using a lower semiconductor layer as in the prior art, epitaxial silicon layers in a separated state are provided on an insulating layer to realize the RF integrated circuit. Accordingly, the leakage of current as a result of RF coupling between the substrate and inductors is prevented such that an RF integrated circuit having a high Q factor is obtained. Also, through the use of a silicon wafer on which the other elements of the circuit are formed, overall manufacturing costs are minimized.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for manufacturing an RF integrated circuit comprising the steps of:
   (a1) forming an insulating layer on a silicon wafer, and selectively etching the insulating layer to form a plurality of windows that expose the silicon wafer;
   (b1) forming an epitaxial silicon layer over an entire surface of the insulating layer by an epitaxial growth method using portions of the silicon wafer exposed through the windows, and planarizing the epitaxial silicon layer;
   (c1) selectively etching the epitaxial silicon layer to realize a plurality of epitaxial silicon layers, in which the epitaxial silicon layers of each window region are separated;
   (d1) forming semiconductor elements on the epitaxial silicon layers;
   (e1) forming a PMD layer on the epitaxial silicon layers, and selectively etching the PMD layer to form contact holes for exposing portions of electrodes of the semiconductor elements;
   (f1) providing metal plugs in the contact holes, and forming and patterning a metal film to realize a first metal wiring layer;
   (g1) forming an IMD layer over the first metal wiring layer, and selectively etching the IMD layer such that portions of the first metal wiring layer are exposed to form via holes;
   (h1) providing metal plugs in the via holes to form vias, and forming and patterning a metal film on the IMD layer to form a second metal wiring layer; and
   (i1) forming a capping layer on the second metal wiring layer, and removing the silicon wafer.

2. The method of claim 1 wherein in step (a1), the insulating layer is formed by thermally oxidizing the silicon wafer.

3. The method of claim 1 wherein in step (a1), the insulating layer is formed by CVD process.

4. The method of claim 1 wherein in step (b1), the epitaxial silicon layer is planarized by CMP.

5. The method of claim 1 wherein in step (h1), spiral coils connecting specific vias are formed when the metal film on the IMD layer is patterned.

6. The method of claim 1 wherein after step (i1) of removing the silicon wafer after forming the capping layer on the second metal wiring layer, the capping layer is used as a support and a polishing process is performed on the silicon wafer to remove the silicon wafer.

7. The method of claim 6 wherein a chemical mechanical polishing process is used as the polishing process.

8. The method of claim 1 wherein the capping layer is formed to a thickness of between 50 and 100 $\mu$m.

9. A method for manufacturing an RF integrated circuit comprising the steps of:
- (a2) forming an insulating layer on a silicon wafer, and selectively etching the insulating layer to form a plurality of windows that expose the silicon wafer;
- (b2) forming an epitaxial silicon layer over an entire surface of the insulating layer by an epitaxial growth method using portions of the silicon wafer exposed through the windows, and planarizing the epitaxial silicon layer;
- (c2) forming semiconductor elements on the epitaxial silicon layer;
- (d2) selectively etching the epitaxial silicon layer to realize a plurality of epitaxial silicon layers, in which the epitaxial silicon layers of each window region are separated;
- (e2) forming a PMD layer on the epitaxial silicon layers, and selectively etching the PMD layer to form contact holes for exposing portions of electrodes of the semiconductor elements;
- (f2) providing metal plugs in the contact holes, and forming and patterning a metal film to realize a first metal wiring layer;
- (g2) forming an IMD layer over the first metal wiring layer, and selectively etching the IMD layer such that portions of the first metal wiring layer are exposed to form via holes;
- (h2) providing metal plugs in the via holes to form vias, and forming and patterning a metal film on the IMD layer to form a second metal wiring layer; and
- (i2) forming a capping layer on the second metal wiring layer, and removing the silicon wafer.

10. The method of claim 9 wherein in step (a2), the insulating layer is formed by thermally oxidizing the silicon wafer.

11. The method of claim 9 wherein in step (a2), the insulating layer is formed by CVD process.

12. The method of claim 9 wherein in step (b2), the epitaxial silicon layer is planarized by CMP.

13. The method of claim 9 wherein in step (c2), the semiconductor elements are formed on the epitaxial silicon layer in correspondence with each window region.

14. The method of claim 9 wherein in step (h2), spiral coils connecting specific vias are formed when the metal film on the IMD layer is patterned.

15. The method of claim 9 wherein after step (i2) of removing the silicon wafer after forming the capping layer on the second metal wiring layer, the capping layer is used as a support and a polishing process is performed on the silicon wafer to remove the silicon wafer.

16. The method of claim 15 wherein a chemical mechanical polishing process is used as the polishing process.

17. The method of claim 9 wherein the capping layer is formed to a thickness of between 50 and 100 $\mu$m.

* * * * *